US010290751B2

(12) United States Patent
Yamashita et al.

(10) Patent No.: US 10,290,751 B2
(45) Date of Patent: May 14, 2019

(54) RADIATION DETECTOR COMPRISING AMORPHOUS SELENIUM

(71) Applicant: FUJIFILM CORPORATION, Minato-ku, Tokyo (JP)

(72) Inventors: Seiji Yamashita, Kanagawa (JP); Toshihiro Ise, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 192 days.

(21) Appl. No.: 14/715,614

(22) Filed: May 19, 2015

(65) Prior Publication Data
US 2015/0255636 A1    Sep. 10, 2015

Related U.S. Application Data

(63) Continuation of application No. PCT/JP2013/082736, filed on Dec. 5, 2013.

(30) Foreign Application Priority Data

Dec. 10, 2012 (JP) .................................. 2012-269699

(51) Int. Cl.
*H01L 31/08* (2006.01)
*H01L 31/09* (2006.01)
(Continued)

(52) U.S. Cl.
CPC .... *H01L 31/0272* (2013.01); *H01L 27/14676* (2013.01); *H01L 31/085* (2013.01);
(Continued)

(58) Field of Classification Search
CPC ............... H01L 31/0272; H01L 31/117; H01L 27/14676; H01L 31/085; H01L 31/095; H01L 2031/0344
See application file for complete search history.

(56) References Cited

U.S. PATENT DOCUMENTS

2008/0203336 A1* 8/2008 Irisawa .................. G01N 23/04
250/591
2008/0272320 A1* 11/2008 Imai ......................... G01T 1/24
250/580
(Continued)

FOREIGN PATENT DOCUMENTS

JP    2001-264443 A    9/2001
JP    2004-165480 A    6/2004
(Continued)

OTHER PUBLICATIONS

English translation of JP 2009-032854 A.*
(Continued)

*Primary Examiner* — Kevin Parendo
(74) *Attorney, Agent, or Firm* — Solaris Intellectual Property Group, PLLC

(57) ABSTRACT

A radiation detector (10) which has a multilayer structure that includes: a first electrode (34); a second electrode (49) that is disposed so as to face the first electrode; a selenium layer (48) that is disposed between the first electrode and the second electrode and contains amorphous selenium; a first blocking organic layer (38) that is adjacent to the selenium layer, between the first electrode and the selenium layer, and that contains a hole transport material having an electron affinity of 3.7 eV or less; and a second blocking organic layer (37) that is adjacent to the selenium layer, between the second electrode and the selenium layer, and that contains an electron transport material having an ionization potential of 5.9 eV or more. This radiation detector (10) has low dark current, excellent durability, and less afterimages.

16 Claims, 3 Drawing Sheets

(51) Int. Cl.
*H01L 31/20* (2006.01)
*H01L 51/00* (2006.01)
*H01L 51/42* (2006.01)
*H01L 27/146* (2006.01)
*H01L 31/115* (2006.01)
*H01L 31/117* (2006.01)
*H01L 31/0256* (2006.01)
*H01L 31/0272* (2006.01)

(52) U.S. Cl.
CPC .......... *H01L 31/095* (2013.01); *H01L 31/115* (2013.01); *H01L 31/117* (2013.01); *H01L 31/20* (2013.01); *H01L 51/4213* (2013.01); *H01L 51/0037* (2013.01); *H01L 51/0046* (2013.01); *H01L 2031/0344* (2013.01); *Y02E 10/549* (2013.01)

(56) References Cited

U.S. PATENT DOCUMENTS

| | | | |
|---|---|---|---|
| 2009/0026379 A1 | 1/2009 | Yaegashi et al. | |
| 2009/0250619 A1* | 10/2009 | Nakamura | H01L 27/14665 250/370.09 |
| 2010/0230607 A1* | 9/2010 | Kitada | G01T 1/241 250/370.08 |
| 2010/0307791 A1* | 12/2010 | Kim | H01B 1/128 174/126.1 |
| 2011/0110497 A1* | 5/2011 | Nishino | A61B 6/04 378/98.8 |
| 2011/0140100 A1* | 6/2011 | Takata | H01L 29/7869 257/43 |
| 2011/0215250 A1* | 9/2011 | Ohta | G01T 1/24 250/370.08 |
| 2011/0220200 A1* | 9/2011 | Lessmann | B82Y 10/00 136/258 |
| 2012/0241629 A1* | 9/2012 | Kuwabara | A61B 6/4233 250/362 |

FOREIGN PATENT DOCUMENTS

| | | | | |
|---|---|---|---|---|
| JP | 2006-156555 A | 6/2006 | | |
| JP | 2007-199065 A | 8/2007 | | |
| JP | 2008-244412 A | 10/2008 | | |
| JP | 2009-032854 | * | 2/2009 | ............ H01L 31/00 |

OTHER PUBLICATIONS

English language translation of the following: Office action dated Dec. 5, 2016 from the SIPO in a Chinese patent application No. 201380062142.4 corresponding to the instant patent application. This office action translation is submitted now in order to supplement the understanding of the cited reference which is being disclosed in the instant Information Disclosure Statement.

English language translation of the following: Office action dated Aug. 3, 2017 from the SIPO in a Chinese patent application No. 201380062142.4 corresponding to the instant patent application.

* cited by examiner

RADIATION DETECTOR COMPRISING AMORPHOUS SELENIUM

CROSS-REFERENCE TO RELATED APPLICATION

This application is a Continuation of PCT International Application No. PCT/JP2013/082736, filed Dec. 5, 2013, which claims priority under 35 U.S.C. § 119(a) to Japanese Patent Application No. 2012-269699 filed Dec. 10, 2012. Each of the above applications is hereby expressly incorporated by reference, in its entirety, into the present application.

BACKGROUND OF THE INVENTION

Technical Field

The present invention relates to a radiation detector.

BACKGROUND ART

Detectors that perform imaging by irradiation with electromagnetic waves such as X-rays are widely used, for example, in medical fields, industrial fields, nuclear energy fields, and the like.

For example, in radiation detectors, a subject is irradiated with radiation and the intensity of radiation that has passed through the subject is detected, whereby information on the inside of the subject is obtained. Such radiation detectors are roughly divided into direct conversion type detectors and indirect conversion type detectors. A direct conversion type detector is a type that directly converts the radiation that has passed through a subject into electric signals, and extracts the electric signals to the outside. Further, an indirect conversion type detector is a type that allows the radiation that has passed through a subject to enter a fluorescent substance, thereby converting the radiation once into visible light, then converts this visible light into electric signals, and then extracts the electric signals to the outside.

In general, in a direct conversion type radiation detector, the incident radiation (for example, X-ray) is directly converted into electric signals (electric charges) by an X-ray-electric charge conversion film that is sensitive to radiation. FIG. 3 is a view schematically showing a basic configuration of a direct conversion type radiation sensor (detector). The radiation sensor is equipped with: TFT substrate 100, on a surface of which, numerous collection electrodes (not shown in the figure) are formed in a two-dimensional matrix arrangement within a radiation detection effective area SA, and which is provided with an electric circuit (not shown in the figure) for storing and reading out electric charges collected by the respective collection electrodes, accompanying the incidence of radiation; X-ray-electric charge conversion film 102 which is layered on a surface of the TFT substrate 100 at a side where the collection electrodes are formed; and common electrode (bias electrode) 104 for applying bias voltage, the common electrode being planarly and widely formed on the front surface of the X-ray-electric charge conversion film 102.

A bias voltage from a bias supply source is applied to the common electrode 104, and in the state of the bias voltage being applied, electric charges are generated in the X-ray-electric charge conversion film 102, accompanying the incidence of radiation to the detection object. The electric charges collected by the collection electrodes are extracted as radiation detection signals from the respective collection electrodes by the electric circuit for collecting and reading out, the electric circuit including a capacitor, a switching element, an electric wire, and the like.

In the direct conversion type radiation detector shown in FIG. 3, semiconductor film (X-ray-electric charge conversion film) 102 is disposed between the TFT substrate 100 and the electrode 104. However, in order to suppress an increase in dark current, peeling of film, and the like, there are cases in which an organic film is provided between the X-ray-electric charge conversion film 102 and the electrode (the bias electrode or the charge collection electrode).

For example, Japanese Patent Application Laid-Open (JP-A) No. 2001-264443 discloses a planar X-ray detector, in which a hole transport layer is provided on one face that contacts the X-ray-electric charge conversion film, and an electron transport layer is provided on the other face. Further, in this document, organic materials, such as an oxadiazole derivative or the like, are exemplified as the material of the hole transport layer, and organic materials, such as TPD or the like, are exemplified as the material of the electron transport layer.

JP-A No. 2004-165480 discloses an image recording medium which has a laminate structure of "a first electrode/a suppression layer (an organic film)/a photo-conductive layer for recording, the photo-conductive layer containing a-Se as the main component".

JP-A No. 2008-244412 discloses a radiation detector, in which an electron transport layer is formed between a photo-conductive layer for recording and a voltage application electrode or between a photo-conductive layer for recording and a charge collection electrode.

JP-A No. 2007-199065 discloses an amorphous selenium flat panel X-ray imager, which is provided with a non-insulating organic layer between an upper electrode and a charge generator layer that includes selenium (Se) as a base. Further, in this document, electron transport materials, such as oxydiazole or the like, are exemplified as the material of the non-insulating organic layer.

JP-A No. 2006-156555 discloses a planar X-ray detector, in which an organic film is interposed between an X-ray-electric charge conversion film and a second electrode.

SUMMARY OF INVENTION

Technical Problem

In radiation detectors of direct conversion type, when a signal charge remains in the radiation-electric charge conversion film, a phenomenon (afterimage), in which the former image pattern remains, may occur and, as a result, poor image quality may be caused. Further, when defects or the like exist in the radiation-electric charge conversion film, an increase in dark current may occur.

In JP-A Nos. 2001-264443, 2004-165480, 2008-244412, 2007-199065, and 2006-156555, a planar X-ray detector, in which selenium is used for an X-ray-electric charge conversion film, and which is equipped with an organic layer that suppresses afterimages or suppresses crystallization of the X-ray-electric charge conversion film, and the like are disclosed. However, suppression of dark current and afterimages from the viewpoint of electric potential is not taken into consideration.

An object of the invention to provide a radiation detector having low dark current, excellent durability, and less afterimages.

Specific means for addressing the above problems are as follows.

<1>. A radiation detector configured to have a laminate structure that includes: a first electrode; a second electrode that is disposed so as to face the first electrode; a selenium layer that is disposed between the first electrode and the second electrode and that contains amorphous selenium; a first blocking organic layer that is adjacent to the selenium layer between the first electrode and the selenium layer, and that contains a hole transport material having an electron affinity of 3.7 eV or less; and a second blocking organic layer that is adjacent to the selenium layer, between the second electrode and the selenium layer, and that contains an electron transport material having an ionization potential of 5.9 eV or more.

<2>. The radiation detector according to the item <1>, wherein the first blocking organic layer that contains the hole transport material is a hole transport layer, and the second blocking organic layer that contains the electron transport material is an electron transport layer.

<3>. The radiation detector according to the item <2>, wherein the hole transport layer includes a first hole transport layer that is adjacent to the selenium layer at a side of the first electrode, and a second hole transport layer that is between the first electrode and the first hole transport layer.

<4>. The radiation detector according to the item <3>, wherein an ionization potential of the second hole transport layer is lower than an ionization potential of the first hole transport layer, and an electron affinity of the second hole transport layer is lower than an electron affinity of the first hole transport layer.

<5>. The radiation detector according to any one of the items <2> to <4>, wherein the electron transport layer includes a first electron transport layer that is adjacent to the selenium layer at a side of the second electrode, and a second electron transport layer that is between the first electron transport layer and the second electrode.

<6>. The radiation detector according to the item <5>, wherein an electron affinity of the second electron transport layer is greater than an electron affinity of the first electron transport layer, and an ionization potential of the second electron transport layer is greater than an ionization potential of the first electron transport layer.

<7>. The radiation detector according to any one of the items <1> to <6>, wherein a glass transition temperature of each of the hole transport materials and the electron transport materials is in a range of from 80° C. to 250° C.

<8>. The radiation detector according to any one of the items <1> to <7>, wherein an ionization potential of the hole transport material is 5.9 eV or less.

<9>. The radiation detector according to any one of the items <1> to <8>, wherein the hole transport material is an aromatic tertiary amine compound.

<10>. The radiation detector according to any one of the items <1> to <9>, wherein the electron transport material is mixed with fullerene in an amount of from 5% by mass to 50% by mass with respect to the electron transport material.

According to the invention, a radiation detector, which has low dark current, excellent durability, and less afterimages may be provided.

DESCRIPTION OF EMBODIMENTS

Figure 1:
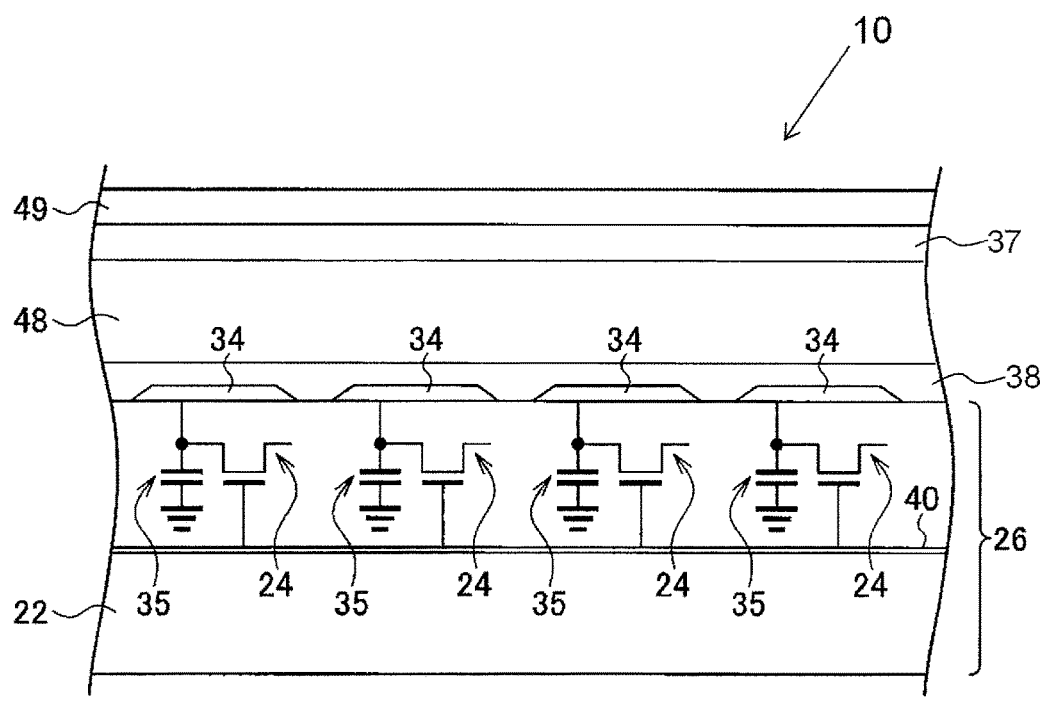
FIG. 1 is a schematic configuration diagram showing an example of the structure of a radiation detector according to the invention.
Figure 2:
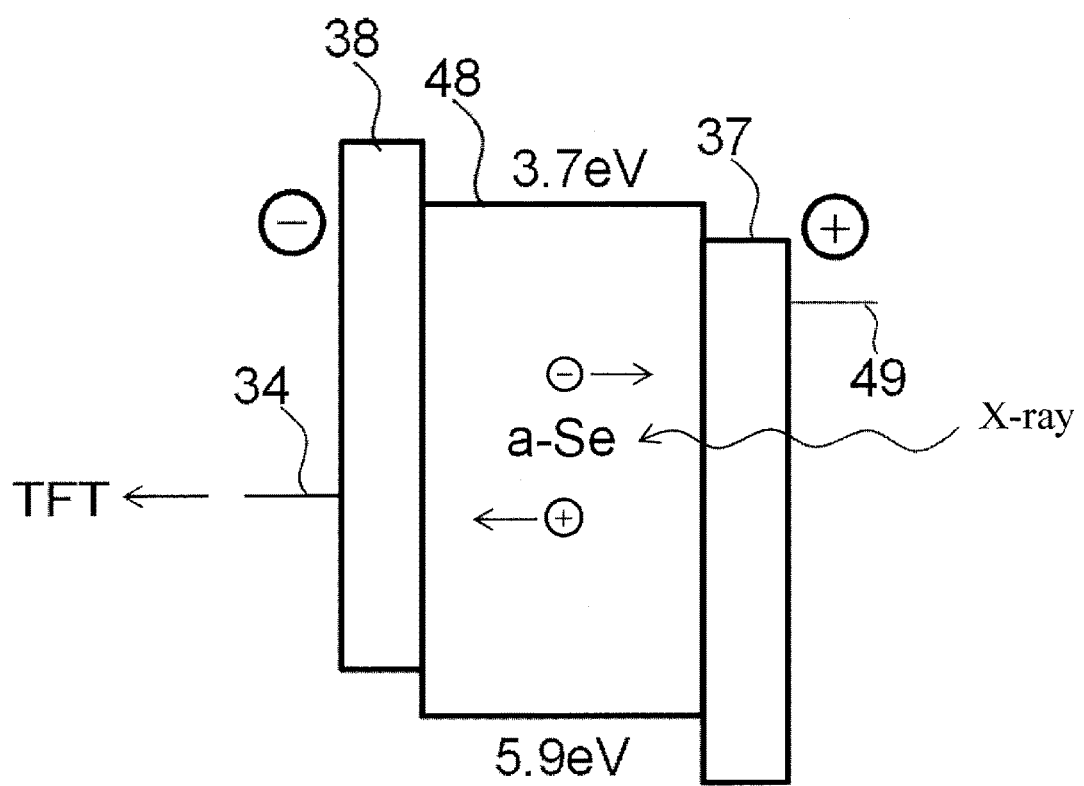
FIG. 2 is an energy diagram of an example of a radiation detector according to the invention.
Figure 3:
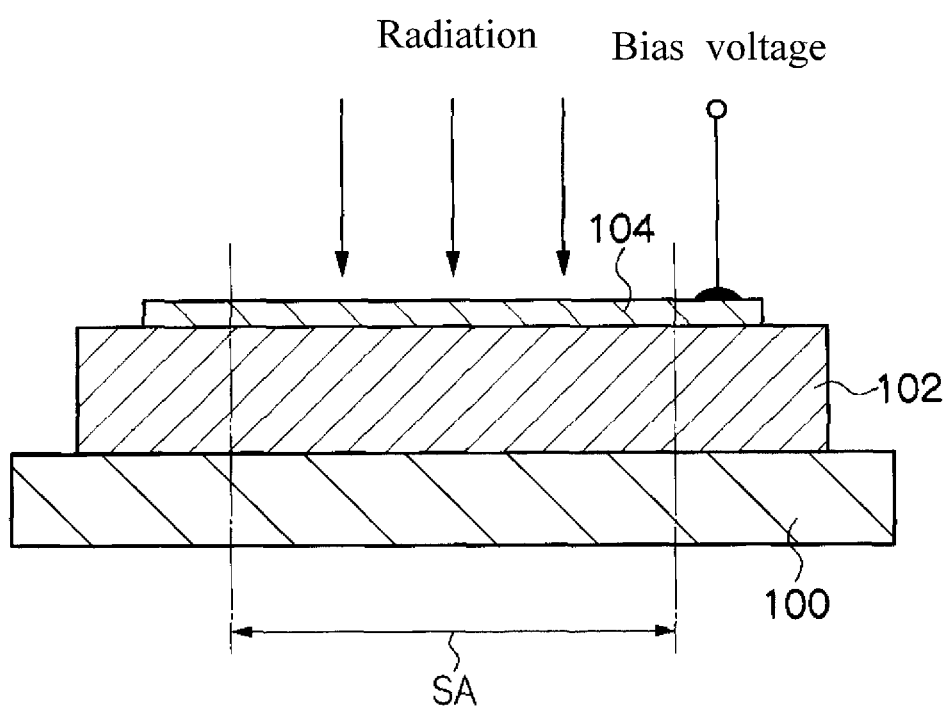
FIG. 3 is a view schematically showing a basic organization of a radiation detector.

Hereinafter, the radiation detector according to the invention is specifically explained with reference to the attached drawings. In the drawings, the same symbol is attached to the member (constituent element) having the same or corresponding function, and explanation is omitted, if appropriate.

The present inventors have paid attention to the fact that the electron affinity (Ea) and ionization potential (Ip) of amorphous selenium are 3.7 eV and 5.9 eV, respectively. In a case in which a selenium layer containing amorphous selenium is used as a radiation-electric charge conversion layer, when a laminate structure, in which a hole transport layer (electron blocking layer) containing a hole transport material having an electron affinity of 3.7 eV or less is placed adjacent to one surface of the selenium layer and an electron transport layer (hole blocking layer) containing an electron transport material having an ionization potential of 5.9 eV or more is placed adjacent to the other surface of the selenium layer, is employed, the present inventors have found that dark current is effectively suppressed due to the electrical barrier between the selenium layer and the respective transport layers when radiation is not entered, and afterimages are effectively attenuated after radiation has entered and an image is formed.

Namely, the radiation detector of the invention is configured to have a laminate structure including: a first electrode; a second electrode that is disposed so as to face the first electrode; a selenium layer that is disposed between the first electrode and the second electrode and contains amorphous selenium; a first blocking organic layer that is adjacent to the selenium layer between the first electrode and the selenium layer and contains a hole transport material having an electron affinity of 3.7 eV or less; and a second blocking organic layer that is adjacent to the selenium layer between the second electrode and the selenium layer and contains an electron transport material having an ionization potential of 5.9 eV or more.

The electron affinity of the hole transport layer according to the invention is more preferably 3.2 eV or less, and even more preferably from 1.5 eV to 2.7 eV. The ionization potential of the electron transport layer according to the invention is more preferably 6.1 eV or more, and even more preferably from 6.4 eV to 7.0 eV.

Note that, in the measurements of electron affinity and ionization potential, there are naturally fluctuation and error (it is thought that fluctuation and error are the reason why there is sometimes a bit difference between the values according to different documents.), and thus in the exemplary embodiment of the invention, the error portion is considered to be 0.3.

In the following exemplary embodiment, the case in which a charge collection electrode (negative electrode) is provided as the first electrode, a bias electrode (positive electrode) is provided as the second electrode, a hole transport layer that transports holes and suppresses migration of electrons is provided as the first blocking organic layer, and an electron transport layer that transports electrons and suppresses migration of holes is provided as the second blocking organic layer is mainly explained, but the invention is not limited to such a configuration. For example, a configuration may also be made, in which a bias electrode (negative electrode) is used as the first electrode, a charge collection electrode (positive electrode) is used as the second electrode, a hole transport layer (first blocking organic layer) is provided between the bias electrode and a selenium layer, and an electron transport layer (second blocking organic layer) is provided between the charge collection electrode and the selenium layer.

FIG. 1 schematically shows an example of the structure of a radiation detector according to the invention. The radiation detector shown in FIG. 1 is direct conversion type X-ray detector 10, and is equipped with TFT substrate 26, in which switching elements 24 such as thin film transistors (TFTs) are formed on insulating substrate 22; and above the TFT substrate 26, a-Se layer 48 that converts the radiation (X-ray) that has entered from the opposite side into electric charges is formed. Each of the gate electrodes of the switching elements 24 is connected to a gate wire 40.

Electron transport layer (hole blocking layer) 37, that is adjacent to the a-Se layer 48, is formed on the a-Se layer 48 (at the X-ray incident side), and further, on the electron transport layer 37, bias electrode (second electrode) 49 for applying a bias voltage to the a-Se layer 48 is formed.

On the other hand, hole transport layer (electron blocking layer) 38 that is adjacent to the a-Se layer 48 and charge collection electrodes (first electrodes) 34 are formed on the TFT substrate 26 side of the a-Se layer 48. Moreover, charge accumulation capacitors 35 are provided, which accumulate electric charges that are generated in the a-Se layer 48 and are collected by the charge collection electrodes 34. The electric charges accumulated in the charge accumulation capacitors 35 are read out by the switching elements 24.

<Selenium Layer>

The selenium layer 48 in the invention is configured to include amorphous selenium (a-Se). When the selenium layer 48 contains numerous crystalline selenium or impurities, durability is low, dark current occurs easily, and image defects occur easily. The selenium layer 48 in the invention includes amorphous selenium as the main component (more than 50% by mass), and it is more preferable that 95% by mass or more of the selenium layer is formed of amorphous selenium. It is preferable that, in the average of the entire selenium layer 48 and also partially, 95% by mass or more of the selenium layer is constituted of amorphous selenium.

The selenium layer 48 containing a-Se can be formed, for example, by vapor deposition using Se as a raw material.

The thickness of the selenium layer 48 can be set, for example, from 100 µm to 2,000 µm.

<Hole Transport Layer>

The hole transport layer 38 is configured to include a hole transport material having an electron affinity of 3.7 eV or less, and is disposed between the charge collection electrode (first electrode) 34 and the amorphous selenium layer (a-Se layer) 48. The hole transport material is a material having a hole injecting ability, a hole transporting ability, and a function of forming a barrier against electrons. Thus, the hole transport layer 38 functions as an electron blocking layer.

The hole transport layer 38 according to the invention may be configured to include one kind or two or more kinds of hole transport materials, or may be formed with plural layers. However, regardless of the number of layers that constitute the hole transport layer 38, the hole transport layer 38 that is adjacent to the a-Se layer 48 is configured to include a hole transport material having an electron affinity (Ea) of 3.7 eV or less, preferably 3.5 eV or less, and more preferably 3.2 eV or less.

Further, from the viewpoint of suppressing afterimages, the ionization potential of the hole transport material incorporated in the hole transport layer 38 is preferably 5.9 eV or less, and more preferably 5.7 eV or less.

As the hole transport material used in the invention, for example, a known material such as a porphyrin compound, a triazole derivative, an oxadiazole derivative, an imidazole derivative, a polyaryl alkane derivative, a pyrazoline derivative, a pyrazolone derivative, an aromatic tertiary amine compound, an amino-substituted chalcone derivative, an oxazole derivative, a styryl anthracene derivative, a fluorenone derivative, a hydrazone derivative, a stilbene derivative, a silazane derivative, an aniline-based copolymer, or an electrically conductive polymer or oligomer, particularly, a thiophene oligomer or the like, may be used.

As the hole transport material, those described above can be used, but an aromatic tertiary amine compound is particularly preferably used.

Representative examples of the aromatic tertiary amine include N,N,N',N'-tetraphenyl-4,4'-diaminobiphenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quardriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylamino stilbene; N-phenylcarbazole, and further, compounds having two condensed aromatic rings in the molecule, which are described in U.S. Pat. No. 5,061,569, for example, 4,4'-bis[N-(1-naphthyl)-N-phenylamino]biphenyl (NPD), and compounds in which three triphenylamine units are connected in a starburst form, which are described in JP-A No. H4-308688, for example, 4,4',4"-tris[N-(3-methylphenyl)-N-phenylamino]triphenylamine (MTDATA) or the like.

Further, a polymer material in which a structure derived from the above hole transport material is introduced in the polymer chain, or a polymer material having a structure derived from the above hole transport material as the polymer main chain can also be used.

The hole transport layer 38 can be formed by using a hole transport material having an electron affinity of 3.7 eV or less and preferably having an ionization potential of 5.9 eV or less, in accordance with a known method, for example, a vacuum deposition method, a spin coating method, a casting method, a printing method including an inkjet method, an LB method (Langmuir-Blodgett method), or the like. Particularly, in a case in which the hole transport material is the above polymer material, a spin coating method, a casting method, a printing method including an inkjet method, or the like is preferably used.

From the viewpoints of suppressing dark current and also suppressing afterimages, the ionization potential of the hole transport material incorporated in the hole transport layer 38 is preferably 5.9 eV or less, and more preferably 5.7 eV or less.

The hole transport layer 38 in the invention may be constituted of a multilayer film including two or more layers. As a basic configuration of the multilayer film, for example, a first hole transport layer that is adjacent to the a-Se layer 48a, and a second hole transport layer that is between the first hole transport layer and the first electrode (negative electrode) 34 may be provided.

The main role of the plural hole transport layers is to select a configuration having an appropriate electric potential such that electric charges are not accumulated at the interface between the hole transport layer and the electrode 34 or amorphous selenium layer 48 or an electric potential capable of more effectively suppressing injection of electric charges from the electrode 34. Specifically, in the case of providing a first hole transport layer adjacent to the a-Se layer 48 at the side of the first electrode (negative electrode) 34, and a second hole transport layer between the first electrode (negative electrode) 34 and the first hole transport layer, it is preferable that the ionization potential of the second hole transport layer is lower than the ionization potential of the first hole transport layer, and further, a configuration in which the electron affinity of the second hole transport layer is lower than the electron affinity of the first hole transport layer is preferable. In a case in which three or more hole transport layers are layered one on another, it is preferable that each Ip and each Ea of the hole transport layers, that are adjacent to each other, have the same relationships as described above, respectively.

The proportion (mass ratio) of the hole transport material having an electron affinity of 3.7 eV or less in the hole transport layer 38 is preferably 10% or higher, more preferably 30% or higher, and particularly preferably 90% or higher. As the other component that constitutes the hole transport layer 38, an insulating organic material can be used. Specific examples include polycarbonate, polystyrene, polymethacrylic acid, and polyvinyl acetate.

The purity of the hole transport material used for film formation is preferably 90% or more, and more preferably 98% or more. Particularly, in a case in which durability is required, the purity is preferably 99.9% or more.

Specific examples of the compound, which may be used for the formation of the hole transport layer 38 of the X-ray detector according to the invention, include the compounds shown below. However, the invention is not limited to these specific examples.

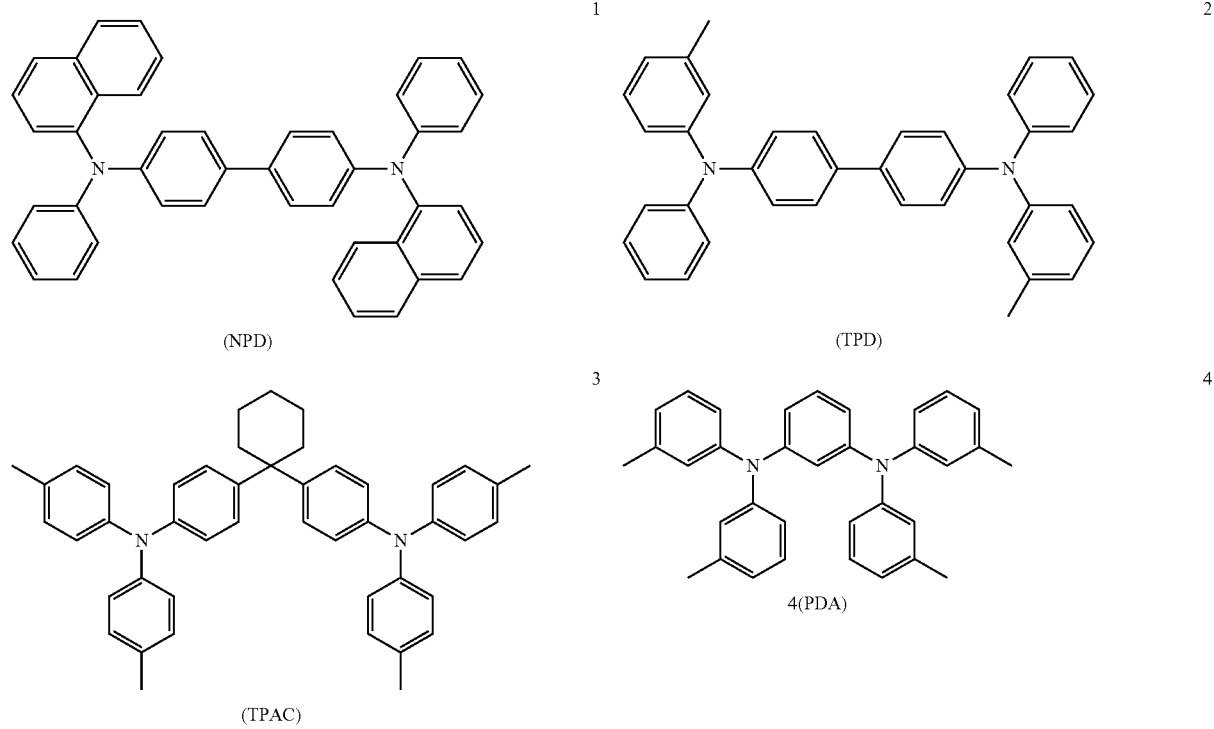

-continued
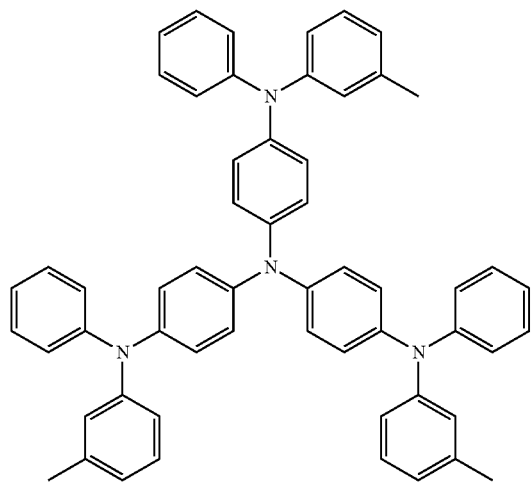
5(m-MTDATA)
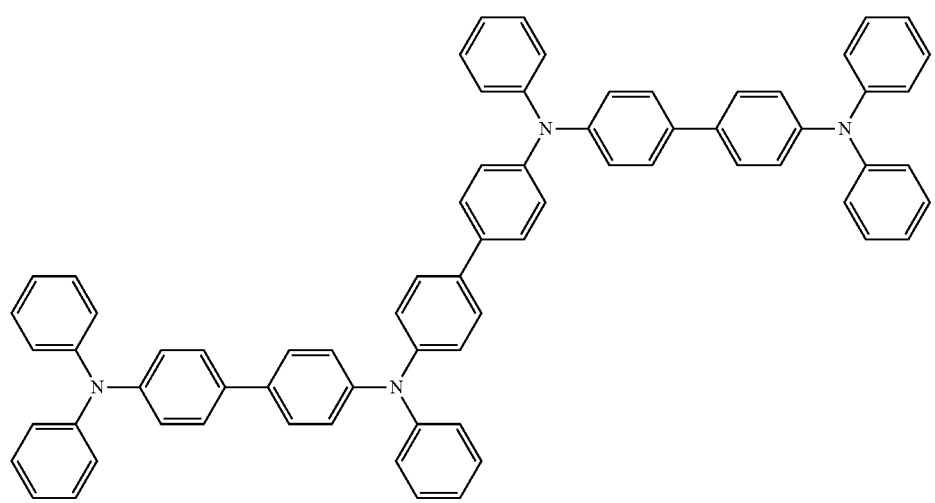
(TPTE)
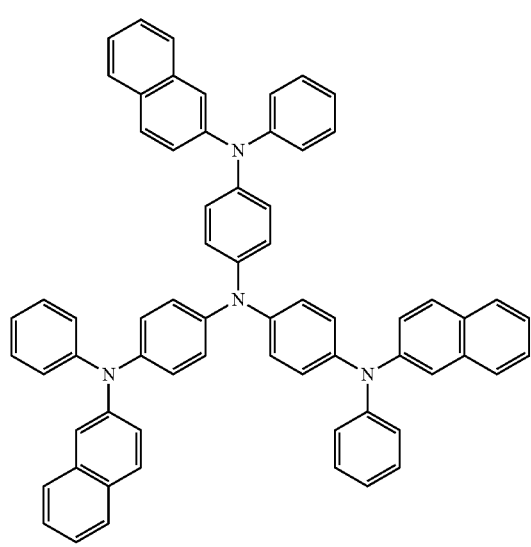
(2-TNATA)
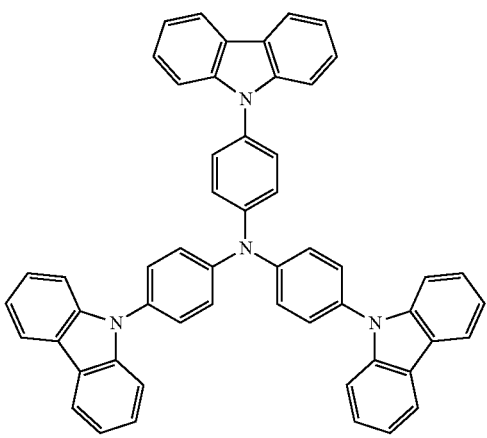
(TCTA)

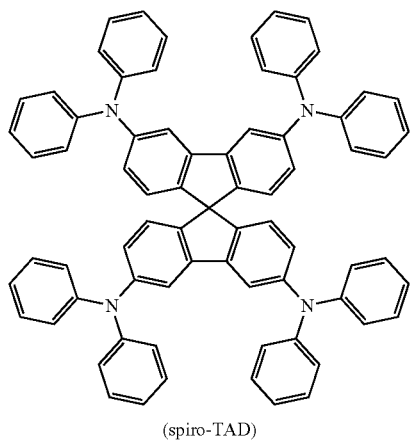
(spiro-TAD)

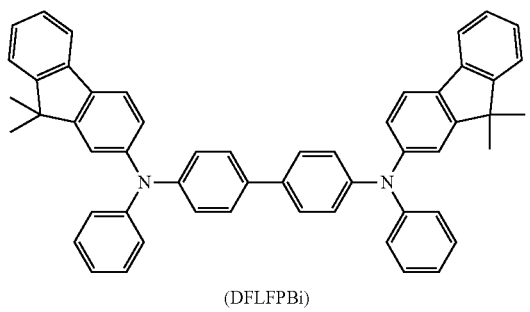
(DFLFPBi)

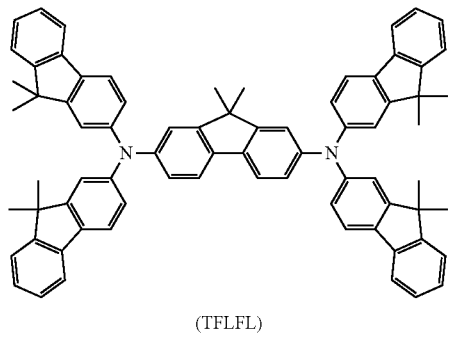
(TFLFL)

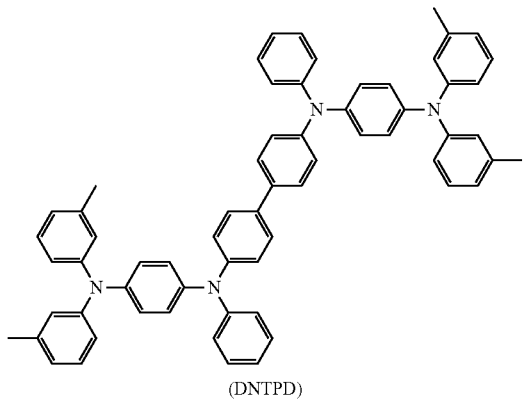
(DNTPD)

<Electron Transport Layer>

The electron transport layer 37 is configured to include an electron transport material having an ionization potential of 5.9 eV or more, and is disposed between the charge collection electrode (second electrode) 49 and the amorphous selenium layer (a-Se layer) 48. The electron transport material is a material having an electron injecting ability, an electron transporting ability, and a function of forming a barrier against holes. Thus, the electron transport layer 37 functions as a hole blocking layer.

The electron transport layer 37 in the invention may be configured to include one kind or two or more kinds of electron transport materials, or may be formed with plural layers. However, regardless of the number of layers that constitute the electron transport layer 37, the electron transport layer 37 that is adjacent to the a-Se layer 48 is configured to include an electron transport material having an ionization potential (Ip) of 5.9 eV or more, and preferably 6.1 eV or more.

In a case in which the electron transport layer 37 in the invention is constituted of a multilayer film including two or more layers, for example, a first electron transport layer that is adjacent to the amorphous selenium layer (a-Se layer) 48, and a second electron transport layer that is between the first electron transport layer and the second electrode (positive electrode) 49 may be provided. In this case, it is preferable that the electron affinity of the second electron transport layer is greater than the electron affinity of the first electron transport layer, and further, a configuration in which the ionization potential of the second electron transport layer is greater than the ionization potential of the first electron transport layer is preferable. Also in the case of layering three or more electron transport layers one on another, it is preferable that each Ip and each Ea of the electron transport layers, that are adjacent to each other, have the same relationships as described above, respectively.

Examples of the electron transport material, which may be used in the invention, include a nitro-substituted fluorene derivative, a diphenylquinone derivative, a thiopyrane dioxide derivative, an aromatic tetracarboxylic anhydride of naphthalene, perylene, or the like, carbodiimide, a fluorenylidenemethane derivative, an anthraquinodimethane derivative, an anthrone derivative, and an oxadiazole derivative. Moreover, a thiadiazole derivative, in which the oxygen atom of the oxadiazole ring in the above oxadiazole derivative is substituted with a sulfur atom, and a quinoxaline derivative having a quinoxaline ring, which is known as an electron withdrawing group, can also be used as the electron transport material.

Further, fullerene C60 and derivatives thereof, and fullerene C70 and derivatives thereof can also be used preferably.

For example, a mixture transport layer in which fullerene or the like, which has an appropriate electron affinity from the viewpoint of supplying/receiving of electron from amorphous selenium, in an amount of from about 5% by mass to about 50% by mass, is mixed with the electron transport material of the electron transport layer 37 can be used preferably.

Further, a polymer material, in which a structure derived from the above electron transport material is introduced into the polymer chain, or a polymer material having a structure derived from the above electron transport material as the polymer main chain can also be used.

Moreover, a metal complex of an 8-quinolinol derivate, for example, tris(8-quinolinol)aluminum (Alq$_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq), or the like, and a metal complex in which the central metal of the above metal complex is replaced with In, Mg, Cu, Ca, Sn, Ga, or Pb can also be used as the electron transport material.

In addition, a metal free or metal-containing phthalocyanine, and a compound in which the terminal of the above phthalocyanine is substituted by an alkyl group, a sulfonic acid group, or the like can also be used preferably as the electron transport material. Furthermore, the distyrylpyrazine derivative exemplified as the material of the light-emitting layer can also be used as the electron transport material.

Particularly, in the case of using fullerene C60, fullerene C70, or a derivative thereof as the electron transport material, it is preferable that the compound is dispersed in an insulating organic material and used. Specific examples of the insulating organic material include polycarbonate, polystyrene, polymethacrylic acid, polyvinyl acetate, and parylenes; however, the invention is not limited thereto.

The electron transport layer 37 can be formed by using an electron transport material having an ionization potential of 5.9 eV or more, in accordance with a known method, for example, a vacuum deposition method, a spin coating method, a casting method, a printing method including an inkjet method, an LB method, or the like.

Specific examples of the compound, which is preferably used for the formation of the electron transport layer 37 in the invention, include the compounds shown below. However, the invention is not limited to these specific examples.

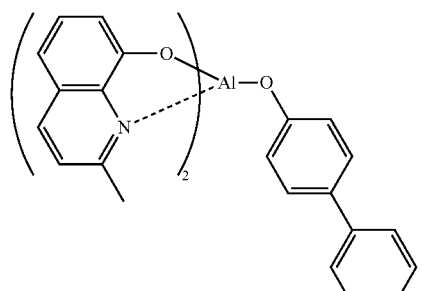

-continued

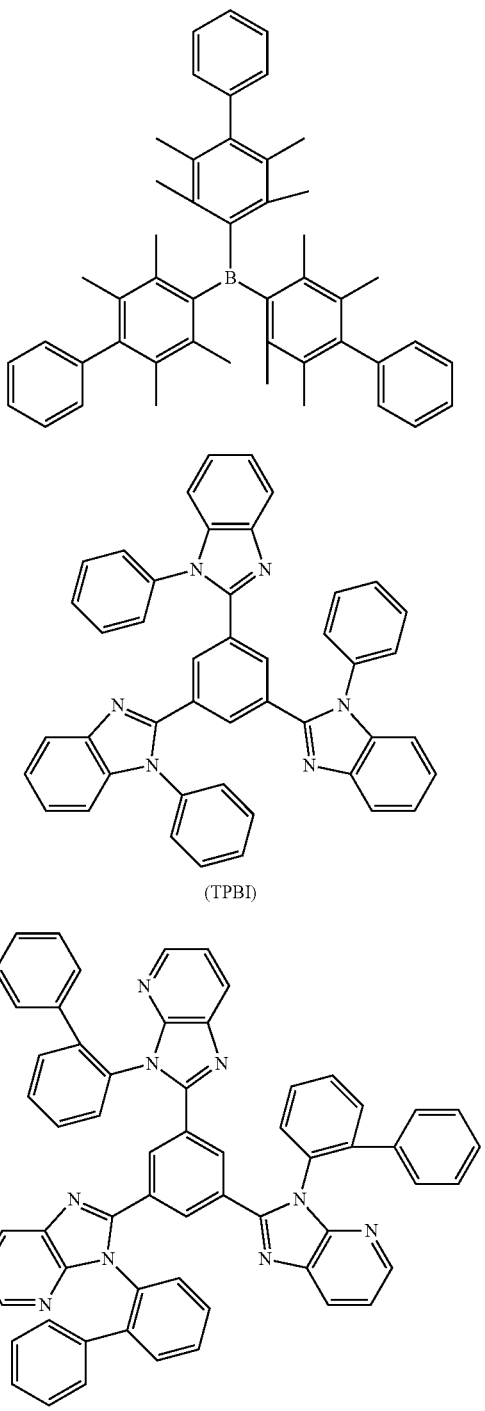

(TPBI)

—Layer Thickness—

Preferable thicknesses of the organic layers (the hole transport layer 38 and the electron transport layer 37) according to the invention are determined from the voltage resistance with respect to the applied voltage, blocking effects of preventing injection of electric charges from the electrodes 34 and 49, the requirement to have sufficient thickness with regard to the surface irregularities of the electrodes 34 and 49 and amorphous selenium layer 48, and the like. Typically, a layer having a film thickness in a range of from 1 nm to 100 µm is preferably used. The film thickness is more preferably from 10 nm to 10 µm. When the thickness is 1 nm or more, the thickness can be easily controlled, and when the thickness is 100 µm or less, the influences of the coating and drying conditions and thickness unevenness can almost completely be left out of account.

—Mobility—

Regarding all of the materials that constitute each of the electron transport layer 37 and the hole transport layer 38 according to the invention, the mobility of the opposite charge relative to the mobility of the main transport charge is preferably 1/100 or less.

Further, it is preferable that, in an electric field intensity of 10 V/µm, the mobility of each of the electron transport material and the hole transport material is $10^{-7}$ cm/V·S or more.

—Glass Transition Temperature—

The glass transition temperature of the a-Se film is generally about 45° C. When the temperature is higher than the glass transition temperature, crystallization proceeds, but in the invention, crystallized selenium is not preferably used for the X-ray absorption photoelectric conversion layer (the radiation-electric charge conversion layer). It is preferable that the charge transport materials (the hole transport material and the electron transport material) used in the invention each have a stabilization effect due to the intermolecular interaction between the charge transport material and the a-Se molecule at the interface between the charge transport material and the a-Se. The glass transition temperatures of each of the charge transport materials according to the invention is preferably 50° C. or higher, more preferably 70° C. or higher, and particularly preferably from 80° C. to 250° C.

<Electrode>

With regard to the negative electrode material used for the negative electrode (first electrode) 34 according to the invention, ITO, IZO, tin oxide, or the like is preferably used.

With regard to the positive electrode material used for the positive electrode (second electrode) 49 according to the invention, Cr, Au, Al, an Al/Mg alloy, or the like is preferably used.

Note that, the electrode to be used as the bias electrode 49 is constituted of an electrode material that transmits radiation.

Further, an intermediate layer formed of LiF or the like, for realizing efficient charge transportation, may be provided between the positive electrode 49 and the electron transport layer 37. Moreover, an intermediate layer for reducing the irregularities of the electrode surface or for reducing the electric potential barrier may also be provided between the negative electrode 34 and the hole transport layer 38.

EXAMPLES

Hereinafter, the examples are explained; however, the present invention is by no means limited to these examples.

First, the electron affinities and ionization potentials of the electron transport materials and hole transport materials used in the following experimental examples of the invention are shown in Table 1. These values are determined from literatures, or from the measurement results using AC-2 (trade name, manufactured by Riken Keiki Co., Ltd.), or by calculation according to the Koopmans method, ΔSCF (Self-Consistent Field) method, or the like.

TABLE 1

| Elector Transport Materials | Electron Affinity (eV) | Ionization Potential (eV) | Hole Transport Materials | Electron Affinity (eV) | Ionization Potential (eV) |
|---|---|---|---|---|---|
| 1 (ALq) | 3.0 | 5.8 | 1 (NPD) | 2.3 | 5.5 |
| 2 (BAlq) | 2.9 | 5.9 | 2 (TPD) | 2.3 | 5.5 |
| 3 (Zap) | 1.7 | 5.6 | 3 (TPAC) | 3.4 | 5.8 |
| 4 (BPhen) | 3.4 | 6.4 | 4 (PDA) | 2.3 | 5.5 |
| 5 (BCP) | 1.8 | 6.1 | 5 (m-MDATA) | 1.9 | 5.1 |
| 6 (PBD) | 2.2 | 6.1 | 6 (TPTE) | 2.3 | 5.3 |
| 7 (TAZ) | 2.3 | 5.7 | 7 (2-TNATA) | 2.2 | 5.2 |
| 8 (OXD-7) | 2.8 | 6.5 | 8 (TCTA) | 2.3 | 5.7 |
| 9 (BMD) | (2.2) | (6.1) | 9 (spiro-TAD) | 3.0 | 5.4 |
| 10 (PyPySPYPy) | 3.3 | >5.9 | 10 (DFLDPBI) | 3.3 | 5.4 |
| 11 (TmBB) | | >5.9 | 11 (TFLFL) | 2.3 | 5.2 |
| 12 (TPBI) | 2.7 | 6.2 | 12 (DNTPD) | 1.8 | 5.1 |
| 13 (TIP-BP) | 3.0 | 6.6 | | | |

Each chemical structure of electron transport materials 1, 3 and 7 is described below respectively.

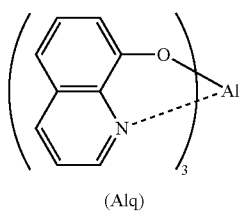

(Alq)

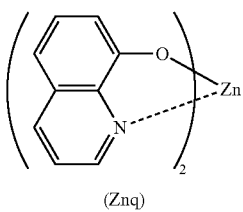

(Znq)

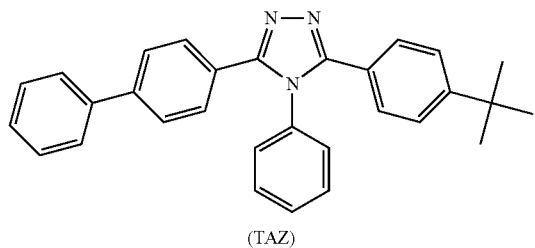

(TAZ)

Further, the glass transition temperatures of the electron transport materials and hole transport materials are shown in Table 2.

TABLE 2

| Electron Transport Materials | Glass Transition Temperature (° C.) | Hole Transport Materials | Glass Transition Temperature (° C.) |
|---|---|---|---|
| 1 (ALq) | 167 | 1 (NPD) | 95 |
| 2 (BAlq) | 99 | 2 (TPD) | 60 |
| 3 (Znp) | >60 | 3 (TPAC) | 78 |
| 4 (BPhen) | 60 | 4 (PDA) | 60 |
| 5 (BCP) | 83 | 5 (m-MDATA) | 75 |
| 6 (PBD) | 60 | 6 (TPTE) | 140 |
| 7 (TAZ) | <60 | 7 (2-TNATA) | 110 |
| 8 (OXD-7) | >60 | 8 (TCTA) | 151 |
| 9 (BND) | <60 | 9 (spiro-TAD) | 133 |
| 10 (PyPySPYPy) | 90 | 10 (DFLDPBI) | 124 |
| 11 (TmBB) | <80 | 11 (TFLFL) | 186 |
| 12 (TPBI) | 127 | 12 (DNTPD) | 98 |
| 13 (TIP-BP) | 141 | | |

Experimental Example I

—Preparation of X-Ray Detector—

On a substrate provided with switching thin film transistors (hereinafter, abbreviated to "TFT") each having a charge collection electrode formed of ITO, a hole transport layer including a compound shown in Table 3 below was formed by using a vacuum deposition method or, with regard to the substance which hardly sublimes in vacuum, by using a spin coating method. Film formation was conducted such that the dry film thickness was 100 nm. In this way, a hole transport layer was formed.

On this substrate, using a vacuum film forming device, while limiting an appropriate film formation region by using a metal mask, selenium was deposited by conducting resistant heating vapor deposition, thereby forming an amorphous selenium layer having a thickness of 1,000 µm on the hole transport layer. It was confirmed that the layer thus formed was constituted of amorphous selenium, by performing X-ray analysis, which is generally used for evaluation of crystallinity, and by performing Raman spectroscopy.

After the formation of the amorphous selenium layer, an electron transport layer was formed by using a compound described in Table 3 in accordance with a resistant heating vapor deposition method or a spin coating method. Film formation was conducted such that the dry film thickness was 100 nm. In this way, an electron transport layer was formed on the amorphous selenium layer.

Subsequently, on the electron transport layer, an upper electrode was formed by using Au as the positive electrode material, such that the thickness of the upper electrode was 150 nm.

In this way, X-ray detectors of the examples and comparative examples each having an electron transport layer and a hole transport layer, which were constituted of a charge transport material shown in the following Table 3, were prepared. In Table 3, "-" means that the corresponding layer is not used.

TABLE 3

| | E. Trans. L | H. Trans. L | IP of ETM | EA of HTM |
|---|---|---|---|---|
| C. Exp. 1 | ETM 7 | HTM 2 | 5.7 | 2.3 |
| C. Exp. 2 | ETM 1 | HTM 2 | 5.8 | 2.3 |
| Exp. 1 | ETM 5 | HTM 2 | 6.1 | 2.3 |
| Exp. 2 | ETM 8 | HTM 2 | 6.5 | 2.3 |
| Exp. 3 | ETM 13 | HTM 2 | 6.6 | 2.3 |
| C. Exp. 3 | — | — | — | — |
| C. Exp. 4 | — | HTM 2 | — | 2.3 |
| C. Exp. 5 | ETM 13 | — | 6.6 | — |

In Table 3, the abbreviation "C. Exp." denotes "Comparative Example Number", the abbreviation "Exp." denotes "Example Number", the abbreviation "E. Trans. L" denotes "Electron Transport Layer", the abbreviation "H. Trans. L" denotes "Hole Transport Layer", the abbreviation "ETM" denotes "Electron Transport Material", the abbreviation "HTM" denotes "Hole Transport Material", the abbreviation "IP" denotes "Inonization Potential", and the abbreviation "EA" denotes "Electron Affinity".

The X-ray detectors of the examples and comparative examples shown in Table 3 were evaluated under the evaluation conditions described below. Results are shown in Table 4.

(Evaluation of Afterimage)

X-ray pulse was irradiated at a tube voltage of 80 kV, in an amount of 300 mR in total, and the afterimage was evaluated in terms of a common logarithm value Log(IA/IL) (also referred to as "lag value") of the ratio of the bright current value (IA) during irradiation of pulse relative to the leak current value (IL) after 15 seconds from the end of pulse. This value being greater corresponds to less after images. The lag value in this evaluation is preferably 3.1 or more, and more preferably 3.3 or more. The results of evaluation on afterimage are shown in Table 4 below.

(Dark Current)

The value of dark current that flows when a voltage of 10 kV is applied was measured. Since dark current accelerates deterioration of the device and lowers the detection sensitivity, it is thought that the lower dark current, the better. In the following Table 4, the dark currents are shown as normalized values, with the value of Comparative Example 3 designated as 100.

TABLE 4

|  | Afterimage | Dark current |
| --- | --- | --- |
| C. Exp. 1 | 2.9 | 15 |
| C. Exp. 2 | 2.9 | 13 |
| Exp. 1 | 3.2 | 5 |
| Exp. 2 | 3.3 | 2 |
| Exp. 3 | 3.4 | 1 |
| C. Exp. 3 | 0.8 | 100 |
| C. Exp. 4 | 1.5 | 40 |
| C. Exp. 5 | 2 | 30 |

Experimental Example II

Preparation of X-ray detectors was conducted in a manner substantially similar to that in Experimental Example I, except that, in Experimental Example I, the electron transport material was fixed and the hole transport material was changed as shown in Table 5 below.

TABLE 5

|  | E. Trans. L | H. Trans. L | IP of ETM | EA of HTM |
| --- | --- | --- | --- | --- |
| C. Exp. 6 | ETM 8 | HTM 3 | 6.5 | 3.4 |
| C. Exp. 7 | ETM 8 | HTM 10 | 6.5 | 3.3 |
| Exp. 4 | ETM 8 | HTM 9 | 6.5 | 3.0 |
| Exp. 5 | ETM 8 | HTM 8 | 6.5 | 2.3 |
| Exp. 6 | ETM 8 | HTM 5 | 6.5 | 1.9 |

In Table 3, the abbreviation "C. Exp." denotes "Comparative Example Number", the abbreviation "Exp." denotes "Example Number", the abbreviation "E. Trans. L" denotes "Electron Transport Layer", the abbreviation "H. Trans. L" denotes "Hole Transport Layer", the abbreviation "ETM" denotes "Electron Transport Material", the abbreviation "HTM" denotes "Hole Transport Material", the abbreviation "IP" denotes "Inonization Potential", and the abbreviation "EA" denotes "Electron Affinity".

With regard to the X-ray detectors of Examples 4 to 6 and Comparative Examples 6 and 7, evaluation of afterimage and dark current value was conducted in a manner substantially similar to that in Experimental Example I. Results are shown in Table 6.

TABLE 6

|  | Afterimage | Dark current |
| --- | --- | --- |
| C. Exp. 6 | 2.9 | 18 |
| C. Exp. 7 | 2.9 | 15 |
| Exp. 4 | 3.1 | 6 |
| Exp. 5 | 3.2 | 3 |
| Exp. 6 | 3.4 | 1 |

Experimental Example III

Preparation of X-ray detectors was conducted in a manner substantially similar to that in Experimental Example I, except that, in Experimental Example I, the Au electrode was changed to an Al/Mg alloy electrode; an LiF layer was formed between the electron transport layer and the Al/Mg alloy electrode by vacuum deposition, such that the thickness of the LiF layer was 10 nm; a film formed of a polymer material having the following structure was formed between the ITO electrode and the hole transport layer, such that the thickness of the film was 30 nm; and the electron transport material and the hole transport material were changed as shown in Table 7 below.

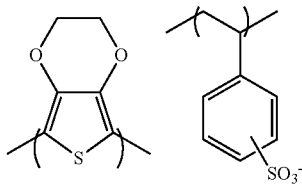

TABLE 7

|  | E. Trans. L | Tg (° C.) | H. Trans. L | Tg (° C.) |
| --- | --- | --- | --- | --- |
| Exp. 7 | ETM 4 | 60 | HTM 10 | 124 |
| Exp. 8 | ETM 5 | 83 | HTM 10 | 124 |
| Exp. 9 | ETM 13 | 141 | HTM 10 | 124 |
| Exp. 10 | ETM 12 | 127 | HTM 10 | 124 |
| Exp. 11 | ETM 12 | 127 | HTM 2 | 60 |
| Exp. 12 | ETM 12 | 127 | HTM 1 | 95 |
| Exp. 13 | ETM 12 | 127 | HTM 8 | 151 |

In Table 7, the abbreviation "Exp." denotes "Example Number", the abbreviation "E. Trans. L" denotes "Electron Transport Layer", the abbreviation "H. Trans. L" denotes "Hole Transport Layer", the abbreviation "Tg" denotes "Glass Transition Temperature", the abbreviation "ETM" denotes "Electron Transport Material", and the abbreviation "HTM" denotes "Hole Transport Material".

(Evaluation of Durability)

The thus prepared X-ray detectors, in the state of voltage of 14 kV being applied, was left under an environment of 40° C. and 70% RH for 300 hours, and the number of image defects that had occurred on the device was evaluated. When the number of image defects exceeds 3,000, the device is deemed as problematic in practical use. Results are shown in Table 8 below.

TABLE 8

| | Number of Image Defects |
|---|---|
| Example 7 | 1810 |
| Example 8 | 310 |
| Example 9 | 30 |
| Example 10 | 100 |
| Example 11 | 2100 |
| Example 12 | 280 |
| Example 13 | 60 |

Experimental Example IV

With regard to the conditions for film formation of the amorphous selenium layer in Experimental Example I, the substrate temperature was raised to 60° C. or higher by heating using a heater and a film having a thickness of 1,000 μm was formed. The film was checked whether the film was constituted of amorphous selenium by Raman spectroscopy. Measurement was conducted with regard to ten different points at the film surface and, as a result, a Raman spectrum that shows the case in which crystallization has occurred was observed at five points among the ten points.

Preparation of X-ray detectors of Comparative Examples 9, 10, and 11 was conducted in a manner substantially similar to that in Examples 1, 2, and 3 in Experimental Example I, respectively, except the manner of film formation of a selenium layer. Evaluation of dark current in Experimental Example I and durability in Experimental Example III was performed. With regard to all the X-ray detectors thus prepared, the dark current exceeded 1,000 and, in the evaluation of durability, the number of image defects exceeded 10,000. From this result, it is thought that it is essential for the selenium layer used in the X-ray detector of the invention to be in the amorphous state.

Experimental Example V

Preparation of X-ray detectors (Examples 14, 15, and 16) was conducted in a manner substantially similar to that in Examples 1, 2, and 3 in Experimental Example I, respectively, except that an electron transport layer was formed through adding fullerene (C60) at a mass ratio of 20%, instead of forming an electron transport layer using only an electron transport material in Experimental Example I.

Evaluation of afterimage was performed in a manner described in Experimental Example I. As a result, the afterimage characteristics were better than the afterimage characteristics of Examples 1, 2, and 3, respectively.

In the electron transport layer, fullerene functions as an electron transport material, but the electron affinity and ionization potential of fullerene are 3.9 eV and 6.1 eV, respectively. From this result, it is thought that a mixture of an electron transport material and an insulating material can be preferably used for the electron transport layer according to the invention.

Experimental Example VI

Preparation of an X-ray detector (Example 17) was conducted in a manner substantially similar to that in Example 5 described in Experimental Example II, except that the hole transport layer was divided into two layers, a second hole transport layer having a thickness of 50 nm was formed on the ITO electrode by using the hole transport material 5, and then, a first hole transport layer was formed by using the hole transport material 8.

Evaluation of afterimage (lag value) and dark current was performed in a manner substantially similar to that in Experimental Example II and, as a result, the afterimage was 3.5, and the dark current was 0.3. Accordingly, it was revealed that the characteristics were further improved.

Experimental Example VII

Preparation of X-ray detectors (Examples 18, 19, and 20) was conducted in a manner substantially similar to that in Examples 1, 2, and 3 in Experimental Example I, respectively, except that, in Experimental Example I, the electron transport layer was divided into two layers such that the thickness was halved, and an electron transport layer formed through adding fullerene (C60) at a mass ratio of 20%, similar to Experimental Example V, to the second (at the side that contacts the gold electrode) electron transport layer from the bottom was formed on the film-formed selenium. Evaluation of afterimage was performed in a manner described in Experimental Example I. As a result, X-ray detectors which exhibited more excellent anti-afterimage performance, as compared with the devices of Examples 14, 15, and 16 in Experimental Example V, and which did not exhibit an increase in dark current were obtained. Accordingly, it was revealed that the characteristics were further improved. It is thought that, with respect to the injection of holes from the Au electrode, the first electron transport layer blocks the injection, and with regard to the electrons generated in the selenium film at the time of X-ray irradiation, since the electron transport property of the second electron transport layer is further enhanced by fullerene, the afterimage phenomenon is suppressed.

The foregoing description of the exemplary embodiments of the present invention has been provided for the purposes of illustration and description. It is not intended to be exhaustive or to limit the invention to the precise forms disclosed. The embodiments were chosen and described in order to best explain the principles of the invention and its practical applications, thereby enabling others skilled in the art to understand the invention for various embodiments and with the various modifications as are suited to the particular use contemplated.

Japanese Patent Application No. 2012-269699 filed Dec. 10, 2012, is hereby expressly incorporated by reference, in its entirety, into the present application. All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. An X-ray detector, configured to have a laminate structure that comprises:
   a first electrode;
   a second electrode that is disposed so as to face the first electrode;

a selenium layer that is disposed between the first electrode and the second electrode, the selenium layer containing amorphous selenium, and converting X-rays to electrons;

no fluorescent material layer;

a first blocking organic layer that is adjacent to the selenium layer, between the first electrode and the selenium layer, and that contains a hole transport material having an electron affinity of 3.7 eV or less; and a second blocking organic layer that is adjacent to the selenium layer, between the second electrode and the selenium layer, and that contains an electron transport material having an ionization potential of 9 eV or more, wherein the hole transport material comprises at least one compound selected from the group consisting of:

6(TPTE)

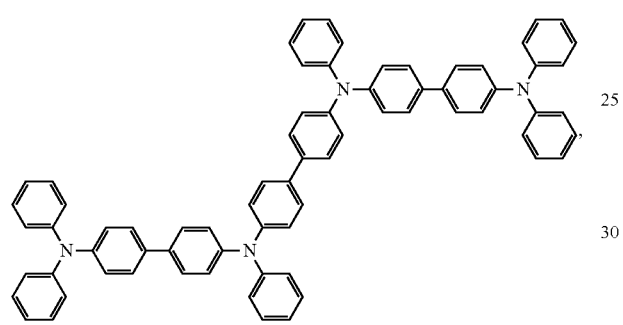

8(TCTA)

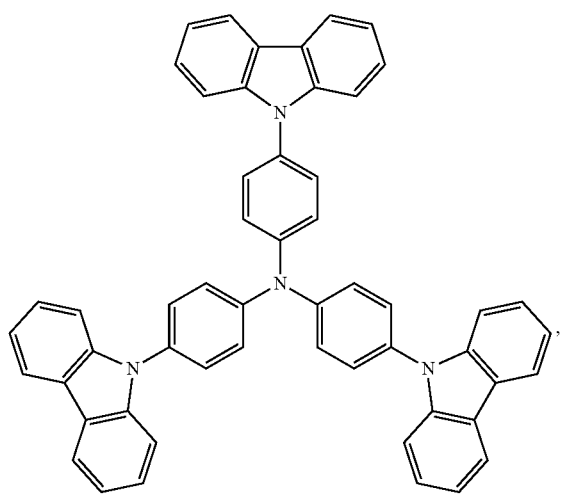

9(spiro-TAD)

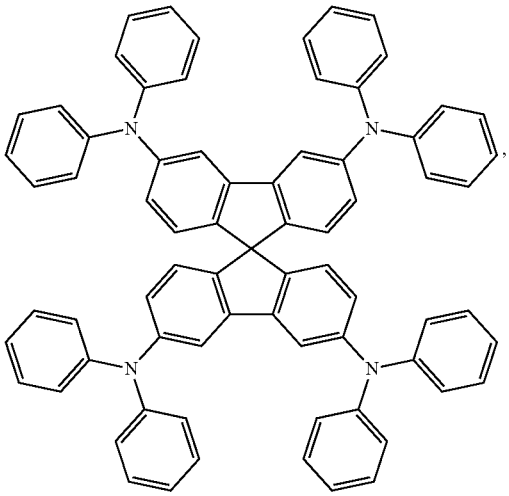

10(DFLDPBi)

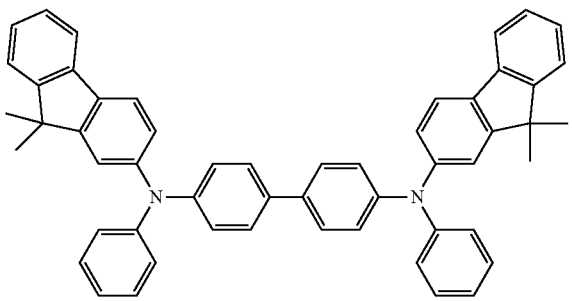

11(TFLFL)

and

12(DNTPD)
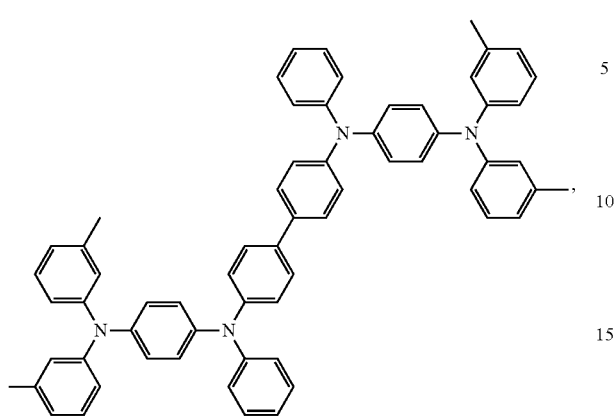
and the electron transport material comprises at least one compound selected from the group consisting of:
1(Alq)
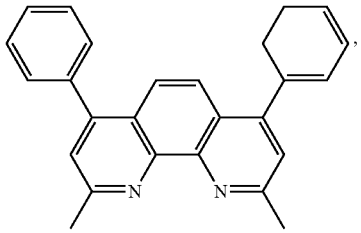
2(BAlq)
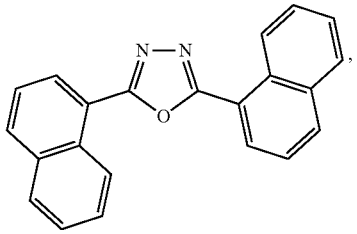
3(Znq)
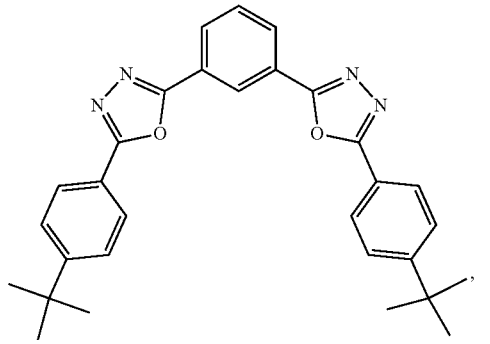
4(BPhen)
5(BCP)
8(OXD-7)
9(BND)
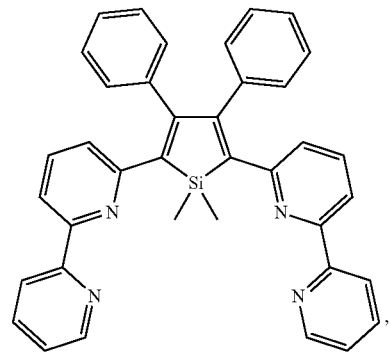
10
11
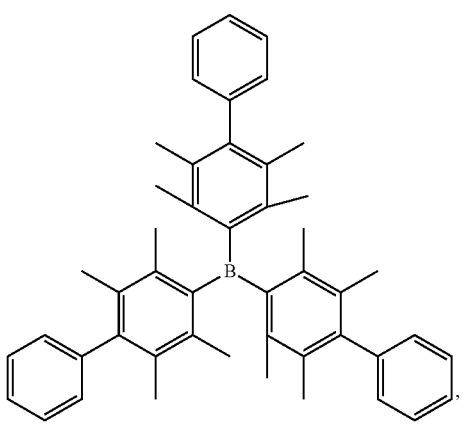

-continued

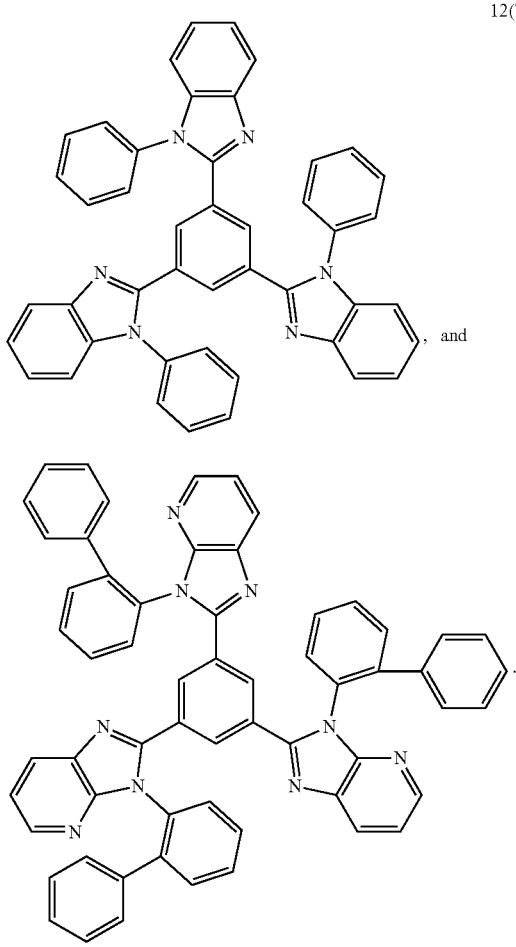

2. The X-ray detector according to claim 1, wherein the first blocking organic layer that contains the hole transport material is a hole transport layer, and the second blocking organic layer that contains the electron transport material is an electron transport layer.

3. The X-ray detector according to claim 2, wherein the hole transport layer comprises a first hole transport layer that is adjacent to the selenium layer at a side of the first electrode, and a second hole transport layer that is between the first electrode and the first hole transport layer.

4. The X-ray detector according to claim 3, wherein an ionization potential of the second hole transport layer is lower than an ionization potential of the first hole transport layer, and an electron affinity of the second hole transport layer is lower than an electron affinity of the first hole transport layer.

5. The X-ray detector according to claim 2, wherein the electron transport layer comprises a first electron transport layer that is adjacent to the selenium layer at a side of the second electrode, and a second electron transport layer that is between the first electron transport layer and the second electrode.

6. The X-ray detector according to claim 5, wherein the hole transport layer comprises a first hole transport layer that is adjacent to the selenium layer at a side of the first electrode, and a second hole transport layer that is between the first electrode and the first hole transport layer, an ionization potential of the second hole transport layer is lower than an ionization potential of the first hole transport layer, and an electron affinity of the second hole transport layer is lower than an electron affinity of the first hole transport layer.

7. The X-ray detector according to claim 6, wherein an electron affinity of the second electron transport layer is greater than an electron affinity of the first electron transport layer, and an ionization potential of the second electron transport layer is greater than an ionization potential of the first electron transport layer.

8. The X-ray detector according to claim 7, wherein a glass transition temperature of each of the hole transport material and the electron transport material is in a range of from 80° C. to 250° C.

9. The X-ray detector according to claim 7, wherein an ionization potential of the hole transport material is 5.9 eV or less.

10. The X-ray detector according to claim 9, wherein the hole transport material is an aromatic tertiary amine compound.

11. The X-ray detector according to claim 10, wherein the electron transport material is mixed with fullerene in an amount of from 5% by mass to 50% by mass with respect to the electron transport material.

12. The X-ray detector according to claim 5, wherein an electron affinity of the second electron transport layer is greater than an electron affinity of the first electron transport layer, and an ionization potential of the second electron transport layer is greater than an ionization potential of the first electron transport layer.

13. The X-ray detector according to claim 1, wherein a glass transition temperature of each of the hole transport material and the electron transport material is in a range of from 80° C. to 250° C.

14. The X-ray detector according to claim 1, wherein an ionization potential of the hole transport material is 5.9 eV or less.

15. The X-ray detector according to claim 1, wherein the hole transport material is an aromatic tertiary amine compound.

16. The X-ray detector according to claim 1, wherein the electron transport material is mixed with fullerene in an amount of from 5% by mass to 50% by mass with respect to the electron transport material.

* * * * *